(12) United States Patent
Ishihara

(10) Patent No.: US 7,622,751 B2  
(45) Date of Patent: Nov. 24, 2009

(54) LIGHT-EMITTING DIODE

(75) Inventor: Kazuya Ishihara, Tsuru (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 12/040,390

(22) Filed: Feb. 29, 2008

(65) Prior Publication Data

US 2008/0210968 A1 Sep. 4, 2008

(30) Foreign Application Priority Data

Mar. 2, 2007 (JP) .............................. 2007-052408

(51) Int. Cl.
*H01L 33/00* (2006.01)
(52) U.S. Cl. .................. 257/99; 257/E33.059
(58) Field of Classification Search ............. 257/98–99, 257/E33.059
See application file for complete search history.

(56) References Cited

U.S. PATENT DOCUMENTS 6,396,082 B1 *  5/2002  Fukasawa et al. ............. 257/79
2003/0168720 A1 *  9/2003  Kamada ...................... 257/666
2004/0036081 A1 *  2/2004  Okazaki ....................... 257/99
2005/0072981 A1 *  4/2005  Suenaga ...................... 257/88
2006/0157859 A1 *  7/2006  Chou .......................... 257/762

FOREIGN PATENT DOCUMENTS

JP        2001-0077430 A     2/1999

* cited by examiner

*Primary Examiner*—Nathan W Ha  
(74) *Attorney, Agent, or Firm*—Browdy and Neimark, PPLC

(57) ABSTRACT

A light-emitting diode includes: a light-transmitting substrate; a light-emitting element mounted on the upper surface of the light-transmitting substrate; and a light-transmitting resin that seals the light-emitting element. The outer surface of the light-transmitting resin is covered with a reflecting layer formed from a silver or aluminum thin film. The light emitted from the light-emitting element is reflected from the reflecting layer, and the reflected light is guided out from the lower surface of the light-transmitting substrate in an efficient manner with minimum wastage of light intensity, and thus, high luminance light can be emitted.

5 Claims, 4 Drawing Sheets

LIGHT-EMITTING DIODE

CROSS-REFERENCE TO THE RELATED APPLICATION

This application is based on and claims priority from Japanese Patent Application No. 2007-52408, filed on Mar. 2, 2007, the disclosure of which is incorporated herein by reference in its entirety.

BACKGROUND OF THE INVENTION

1. Field of the Invention

The present invention relates to a light-emitting diode such as a light-emitting diode for general lighting, a light-emitting diode for flashlight used in cameras and cellular phones, and a light-emitting diode for key illumination.

2. Description of Related Art

With the reduction in size of electronic devices, light-emitting diodes (hereinbelow abbreviated as LEDs) used in such electronic devices and the like are required to be further reduced in size and thickness. Surface-mount-type LEDs are often used as such LEDs and are generally composed of: an insulating substrate having electrode patterns formed on a surface thereof; a light-emitting element mounted on the substrate; and a light-transmitting resin that seals the light-emitting element. When such an LED is used with its front surface facing down and disposed in a motherboard, the light-transmitting resin is inserted in a hole which is provided in and penetrating the motherboard, and the upper peripheral edges of the substrate of the LED is bonded to the periphery of the hole of the motherboard (see, for example, pages 3 and 4 and FIG. 4 of Japanese Patent Application Laid-Open No. 2001-77430).

A detailed description of an example of an LED mounted on a motherboard will be given with reference to FIG. 7. The LED 40 includes: a light-transmitting substrate 41 having a substantially rectangular parallelepiped shape; a pair of electrodes 42 and 43 each extend from the upper surface to the lower surface via left or right side surface of the light-transmitting substrate 41, the electrodes being formed by vapor deposition, etching, printing, plating, or the like; a light-emitting element 45 electrically connected to the electrodes 42 and 43 through metal wires 44; and a light-transmitting resin 46 that covers and seals the light-emitting element 45 and the metal wires 44. Note that the light-emitting element 45 is bonded to the light-transmitting substrate 41 with a transparent adhesive 48 containing a fluorescent agent 47 included therein.

A motherboard 50 on which the LED 40 is to be mounted has a hole 51 in which the light-transmitting resin 46 is to be inserted. To mount the LED 40 on the motherboard 50, the light-transmitting resin 46 is inserted into the hole 51 with the LED 40 upside-down, and the upper peripheral edges of the light-transmitting substrate 41 are placed on the motherboard 50. Then, the electrodes 42 and 43 are secured to electrode patterns 52 and 53, respectively, provided on the motherboard 50 with solder 54.

The LED 40 has a structure in which light-shielding electrodes 55 and 56 are provided on the entire upper surface of the light-emitting element 45, and thus, the light-shielding electrodes 55 and 56 shields light emitted from an upper surface of the light-emitting element 45. Therefore, the light reflected from the light-shielding electrodes 55 and 56 is emitted downwards (in upward directions in the sheet of FIG. 7) from the lower surface of the light-transmitting substrate 41 through the transparent adhesive 48 containing the fluorescent agent 47 and then illuminates above the motherboard 50.

However, in the above conventional LED, a part of light emitted from the light-emitting element, particularly the light emitted horizontally from a junction of the light-emitting element, may pass through the light-transmitting resin and could leak below the motherboard.

SUMMARY OF THE INVENTION

It is an object of the present invention to provide an LED in which light is guided out from the lower surface of a light-transmitting substrate having a light-emitting element mounted thereon at the upper surface with minimum wastage of light, achieving a high-luminance of light.

In order to achieve the above object, an LED of the present invention includes: a light-transmitting substrate; a light-emitting element mounted on an upper surface of the light-transmitting substrate; a light-transmitting resin that seals the light-emitting element; and a reflecting layer with which an outer surface of the light-transmitting resin is covered.

In one embodiment, the reflecting layer is a metal film. In another embodiment, the metal film is one of a silver thin film and an aluminum thin film.

Moreover, in another embodiment, the reflecting layer may be a whitish resin material containing titanium oxide dispersed therein.

A recess having a curved concave surface may be formed on a lower surface of the light-transmitting substrate. It is desirable, in this case, that the recess is filled with a resin containing at least one of a light-scattering agent and a fluorescent agent and a central position of the curved concave surface is recessed deeper in the light-transmitting substrate than a peripheral position thereof.

DETAILED DESCRIPTION OF THE PREFERRED EMBODIMENTS

Preferred embodiments of the present invention will be explained in detail below with reference to the accompanying drawings.

Figure 1:
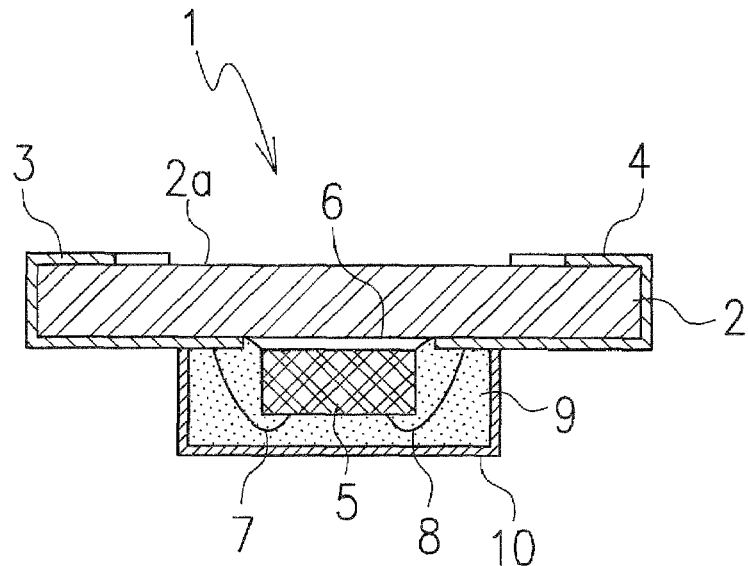
FIG. 1 is a cross-sectional view of an LED according to a first embodiment of the present invention.
Figure 2:
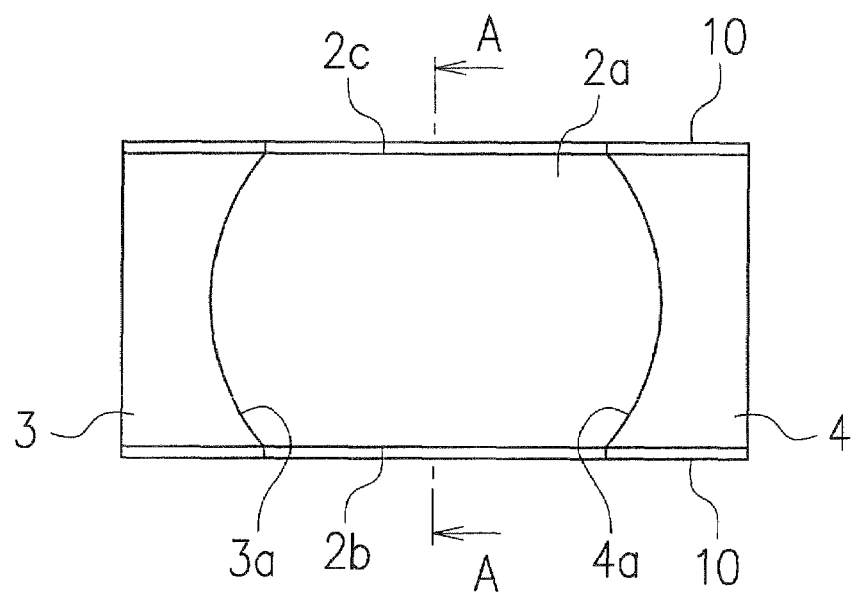
FIG. 2 is a bottom view of the LED in FIG. 1.
Figure 3:
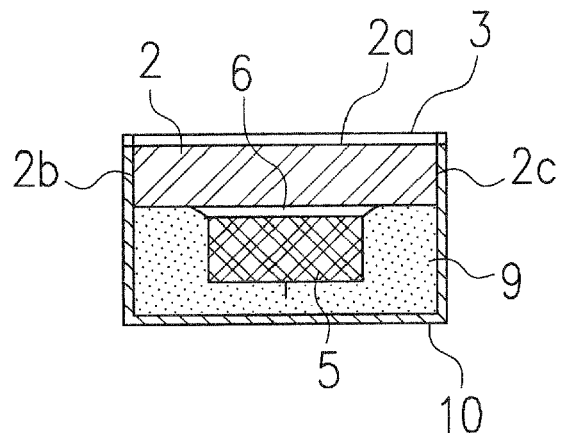
FIG. 3 is a cross-sectional view of the LED taken along the line A-A in FIG. 2.

As shown in FIGS. 1 to 3, an LED 1 according to a first embodiment of the present invention includes: a light-transmitting substrate 2 made of insulating material; a pair of electrodes 3 and 4 formed on a surface of the light-transmitting substrate 2 by vapor deposition, etching, printing, plating or the like; a light-emitting element 5 bonded to a substantially central position of the upper surface of the light-transmitting substrate 2 with a transparent adhesive 6; metal wires 7 and 8 for electrically connecting the light-emitting element 5 to the electrodes 3 and 4, respectively; and a light-transmitting resin 9 that seals the metal wires 7 and 8 and the light-emitting element 5.

A glass epoxy resin substrate, for example, is used as the light-transmitting substrate 2. Each of the electrodes 3 and 4 extends from the upper surface 2 to the lower surface 2a via the left or right side surface of the light-transmitting substrate 2. As shown in FIG. 2, the electrodes 3 and 4 have curved edges 3a and 4a, respectively on a lower surface of the light-transmitting substrate, and the curved edges 3a and 4a are recessed toward respective short side surfaces (in a direction of left or right side surface in the sheet of FIG. 2).

The LED 1 of the present invention includes a reflecting layer 10 which covers the entire outer surface of the light-transmitting resin 9. In this embodiment, the reflecting layer 10 covers not only the outer surface of the light-transmitting resin 9 but also the opposing long-side side-surfaces 2b and 2c of the light-transmitting substrate 2. The reflecting layer 10 is formed from, for example, a metal film. The metal film may be, for example, a silver or aluminum thin film formed by vapor deposition. These silver and aluminum thin films have characteristics of their high-reflection efficiency. In place of the metal film, a whitish resin material containing titanium oxide power may be used as the reflecting layer. If a relatively large amount of titanium oxide power is added to such a resin material, scattered light can be obtained with high reflection efficiency.

Figure 4:
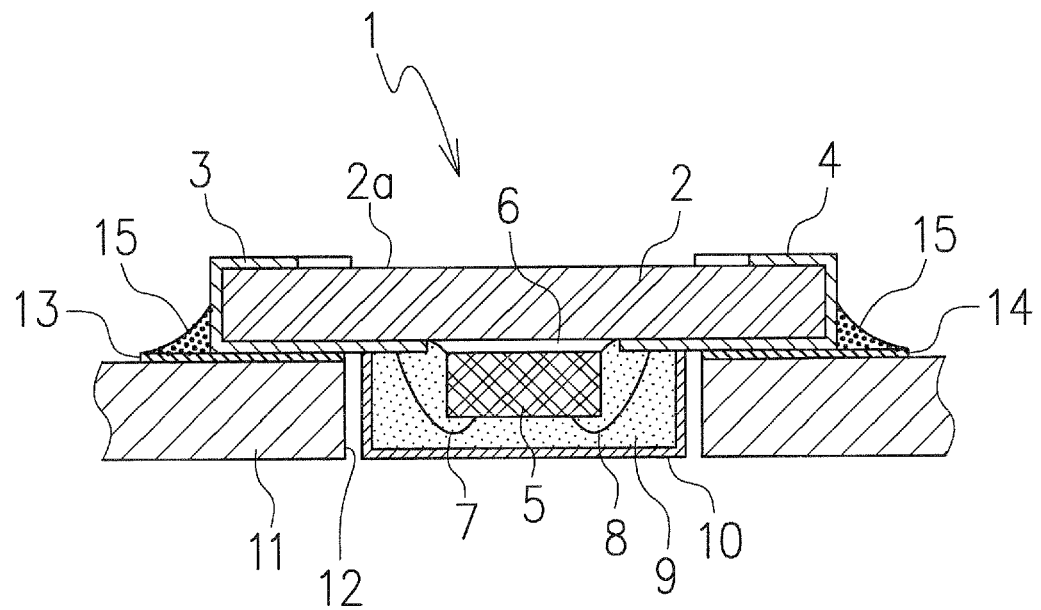
FIG. 4 is a cross-sectional view when the LED shown in FIG. 1 is mounted on a motherboard.

FIG. 4 shows a state in which the LED 1 according to this embodiment is mounted on a motherboard 11. A hole 12 for inserting the light-transmitting resin 9 of the LED 1 is formed in the motherboard 11. To mount the LED 1 on the motherboard 11, the upper surface of the light-transmitting substrate 2 is disposed on the motherboard 11 with the LED 1 upside down and the light-transmitting resin 9 of the LED 1 is disposed in the hole 12 of the motherboard 11. The upper peripheral edges of the light-transmitting substrate 2 are placed around the hole 12, and the electrodes 3 and 4 of the light-transmitting substrate 2 are bonded with solder 15 to electrode patterns 13 and 14, respectively, formed on the motherboard 11. Thus, the mounting is completed.

Next, the operational effect of the LED 1 mounted on the motherboard 11 is described. The light emitted from the light-emitting element 5 is reflected from the reflecting layer 10 that covers the outer surface of the light-transmitting resin 9. The reflected light on the reflecting layer passes through the light-transmitting resin 9, the transparent adhesive 6, and the light-transmitting substrate 2 and is then emitted from the lower surface 2a of the light-transmitting substrate 2. The short-side side-surfaces of the light-transmitting substrate 2 are covered with the electrodes 3 and 4, respectively, and the long-side side-surfaces 2b and 2c are covered with the reflecting layer 10. Therefore, the reflected light is concentrated and emitted from the lower surface 2a of the light-transmitting substrate 2 and thus, resulting in efficient illumination above the motherboard 11.

Figure 5:
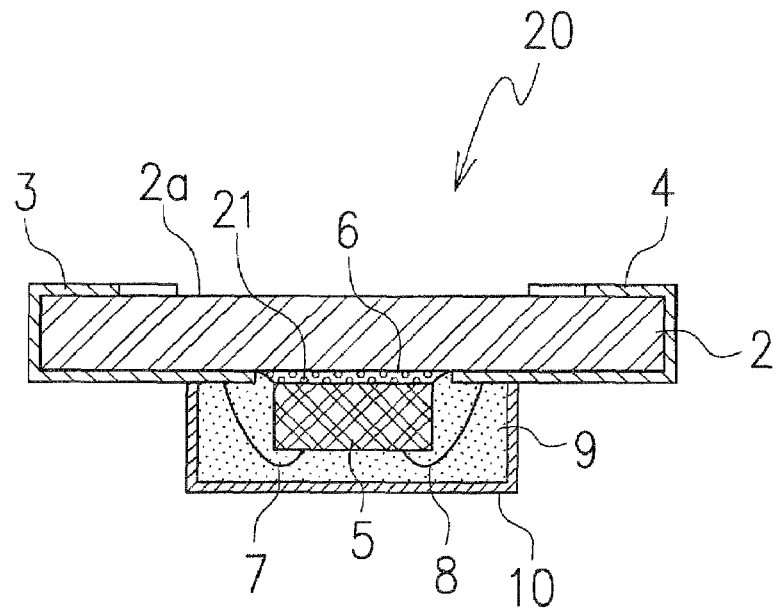
FIG. 5 is a cross-sectional view of an LED according to a second embodiment of the present invention.

FIG. 5 is a cross-sectional view of an LED according to a second embodiment of the present invention. The LED 20 according to this embodiment differs from the LED 1 according to the above first embodiment only in that a light-scattering agent 21 is included in the transparent adhesive 6 that bonded the light-emitting element 5 to the upper surface of the light-transmitting substrate 2. Therefore, the same components as those of the LED 1 according to the first embodiment are designated by the same reference numerals, and detailed descriptions thereof are omitted.

As in the preceding embodiment, in the LED 20 according to the second embodiment, light emitted from the light-emitting element 5 is reflected on the reflecting layer 10 that covers the entire outer surface of the light-transmitting resin 9. The reflected light passes through the light-transmitting resin 9, the transparent adhesive 6, and the light-transmitting substrate 2 and is then emitted from the lower surface 2a of the light-transmitting substrate 2. When the reflected light passes through the transparent adhesive 6, the light is irregularly diffused due to the presence of the light scattering agent 21 included therein, and thus, the luminance of light emitted from the lower surface 2a of the light-transmitting substrate 2 can be improved.

In place of the light-scattering agent 21, a fluorescent agent may be included in the transparent adhesive 6, or both of the agents may be included therein. In the case where the fluorescent agent is included, the wavelength of the reflected light is converted through the transparent adhesive 6, and thus, white light can be obtained. In the case where both the light scattering agent 21 and the fluorescent agent are included in the transparent adhesive 6, both the irregular reflection and wavelength conversion effects on the reflected light can be obtained.

Figure 6:
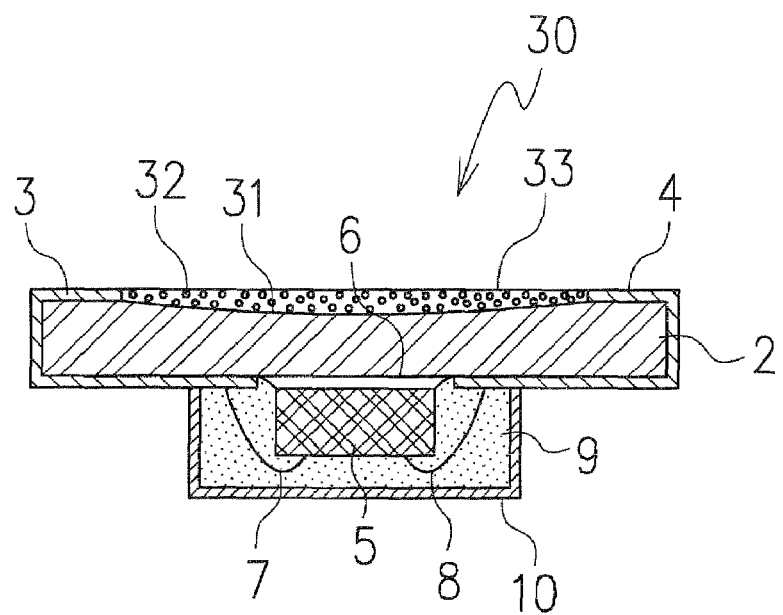
FIG. 6 is a cross-sectional view of an LED according to a third embodiment of the present invention.
Figure 7:
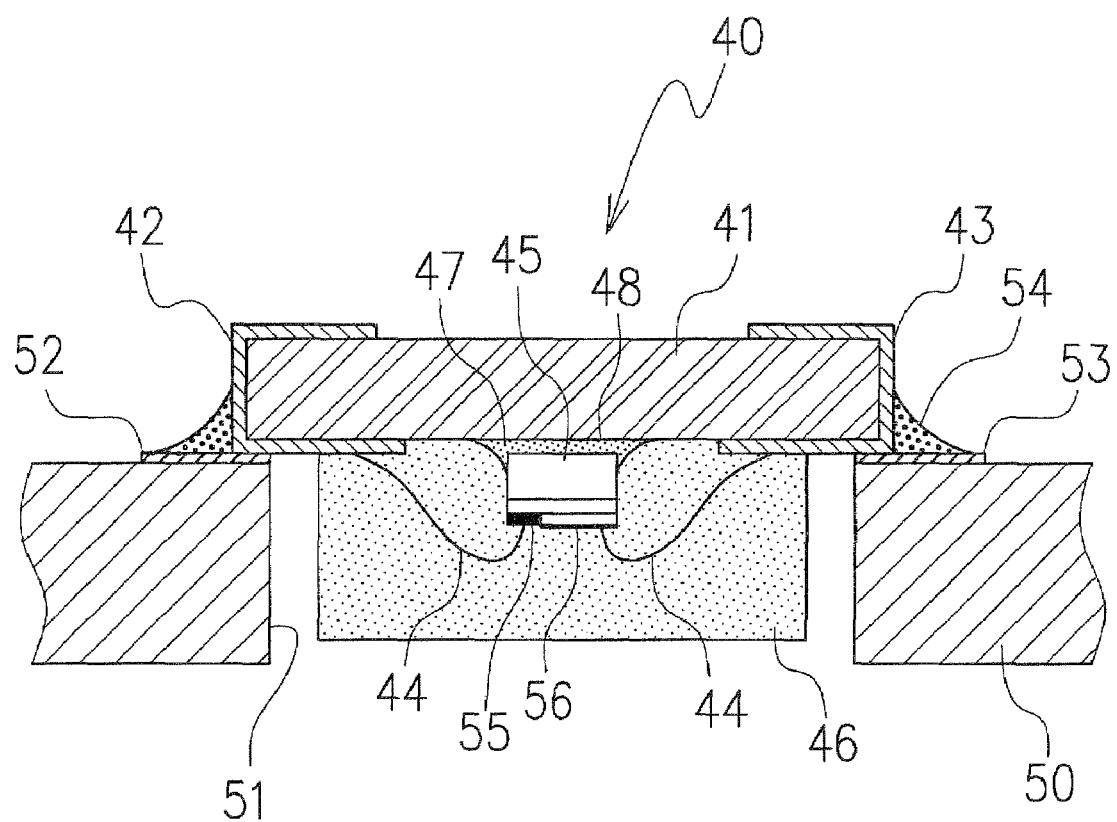
FIG. 7 is a cross-sectional view when a conventional LED is mounted on a motherboard.

FIG. 6 is a cross-sectional view of an LED according to a third embodiment of the present invention. The LED 30 according to this embodiment differs from the LED 1 according to the first embodiment only in that a recess 31 is formed in the lower surface 2a of the light-transmitting substrate 2, on which the light-emitting element 5 is mounted at the upper surface thereof, and that the recess 31 is filled with a transparent resin 33 containing a light-scattering agent 32. Therefore, the same components as those of the LED 1 according to the first embodiment are designated by the same reference numerals, and detailed descriptions thereof are omitted.

The recess 31 has a curved concave surface, whose central position opposite to the light-emitting element 5 is recessed deeper in the light-transmitting substrate toward the light-emitting element 5 than the peripheral position thereof, and thus, the light emitted from the lower surface 2a of the light-transmitting substrate 2 is efficiently improved.

As in the embodiments described above, in the LED 30 according to the third embodiment, light emitted from the light-emitting element 5 is reflected on the reflecting layer 10 that covers the outer surface of the light-transmitting resin 9. The reflected light passes through the light-transmitting resin 9, the transparent adhesive 6, and the light-transmitting substrate 2 and is then emitted from the lower surface 2a of the light-transmitting substrate 2. Moreover, when the reflected light is emitted from the lower surface 2a of the light-transmitting substrate 2, the recess 31 provided in the light-transmitting substrate 2 produces a light-gathering effect similar to that of a concave lens, and the luminance of the light emitted from the lower surface 2a of the light-transmitting substrate 2 is improved by the scattering effect of the light-scattering agent 32 included in the transparent resin 33.

In place of the light-scattering agent 32, a fluorescent agent may be included in the transparent resin 33 of the recess 31, or both the agents may be included therein. In a case like that the fluorescent agent is included, the wavelength of the light is converted at the lower surface 2a of the light-transmitting substrate 2, and thus, white light can be obtained. In the case where both the light scattering agent 32 and the fluorescent agent are dispersed in the transparent resin 33, both the irregular reflection and wavelength conversion effects on the reflected light can be obtained.

Also in the LED 30 according to the third embodiment, the light-emitting element 5 may be bonded to the upper surface of the light-transmitting substrate 2 with the transparent adhesive 6 containing the light-scattering agent and the fluorescent agent included therein, as in the second embodiment. In such a case, in addition to the effects of the light-scattering agent and the fluorescent agent included in the transparent resin 33, the effects of the light-scattering agent and the fluorescent agent included in the transparent adhesive 6 can be obtained at the same time.

In the present invention, the reflecting layer is provided on the surface of the light-transmitting resin that seals the light-emitting element. Accordingly, the light emitted from the light-emitting element is guided out from the lower surface of the light-transmitting substrate having the light-emitting element mounted on the upper surface thereof in an efficient manner with minimum wastage of light intensity, resulting in high luminance of light.

While the preferred embodiments of the present invention have been described above, the present invention is not limited to these embodiments. It should be noted that various modifications and variations may be made to these embodiments.

What is claimed is:

1. A light-emitting diode, comprising:
   a light-transmitting substrate;
   a light-emitting element mounted on an upper surface of the light-transmitting substrate and electrically connected to the light-transmitting substrate;
   a light-transmitting resin that seals the light-emitting element on the upper surface of the light-transmitting substrate; and
   a reflecting layer covering an entire outer surface of the light-transmitting resin,
   wherein the light-transmitting substrate has a recess on a lower surface thereof, the recess has a curved concave surface that is recessed deeper at a central position thereof, and the recess is filled with a resin containing at least one of a light scattering agent and a fluorescent agent.

2. The light-emitting diode according to claim 1, wherein the reflecting layer is a metal film.

3. The light-emitting diode according to claim 2, wherein the metal film is one of a silver thin film and an aluminum thin film.

4. The light-emitting diode according to claim 1, wherein the reflecting layer is a whitish resin layer containing titanium oxide.

5. The light-emitting diode according to claim 1, wherein the light-emitting element is bonded to the upper surface of the light-transmitting substrate with an adhesive, the adhesive containing at least one of a light scattering agent and a fluorescent agent included therein.

* * * * *